United States Patent [19]
Oshima et al.

[11] Patent Number: 4,998,859
[45] Date of Patent: Mar. 12, 1991

[54] TRANSFERRING APPARATUS OPERATED IN A VACUUM CHAMBER

[75] Inventors: Zinichiro Oshima; Kiyoshi Uchiyama; Ikuo Nanno, all of Narashino, Japan

[73] Assignee: Seiko Seiki Kabushik Kaisha, Japan

[21] Appl. No.: 246,406

[22] Filed: Sep. 19, 1988

[30] Foreign Application Priority Data

Oct. 16, 1987 [JP] Japan .................. 62-261222

[51] Int. Cl.$^5$ ............................................. B66C 23/00
[52] U.S. Cl. ..................................... 414/680; 29/740; 29/744; 29/759; 414/751; 414/783
[58] Field of Search ............... 414/217, 680, 749, 751, 414/752, 753, 783, 3; 29/759, 744, 740

[56] References Cited

U.S. PATENT DOCUMENTS

| | | | |
|---|---|---|---|
| 4,542,712 | 9/1985 | Sato et al. | 414/217 X |
| 4,676,884 | 6/1987 | Dimock et al. | 414/225 X |
| 4,768,911 | 9/1988 | Balter | 414/3 |
| 4,790,258 | 12/1988 | Drage et al. | 414/217 X |

Primary Examiner—Robert P. Olszewski
Assistant Examiner—Donald W. Underwood
Attorney, Agent, or Firm—Bruce L. Adams; Van C. Wilks

[57] ABSTRACT

A transferring apparatus comprises a vacuum chamber, a carrier member disposed inside a pipe which communicates with the vacuum chamber, magnetic means installed in a support structure which is moved by a driving means. The carrier member is floated and pulled in its axial direction by magnetic force produced by the magnetic means, whereby an object placed on the tip of a manipulator arm which is connected to the carrier member is transferred in the vacuum chamber. Since the carrier member is floated inside the pipe and moved in its axial direction without contact to the pipe or any other parts, there are no portions inside the pipe which relatively move in contact with each other, and thus fine particles are not generated inside the pipe. This effectively eliminates adhesion of fine particles to objects such as semiconductor devices being transferred in a vacuum chamber.

7 Claims, 9 Drawing Sheets

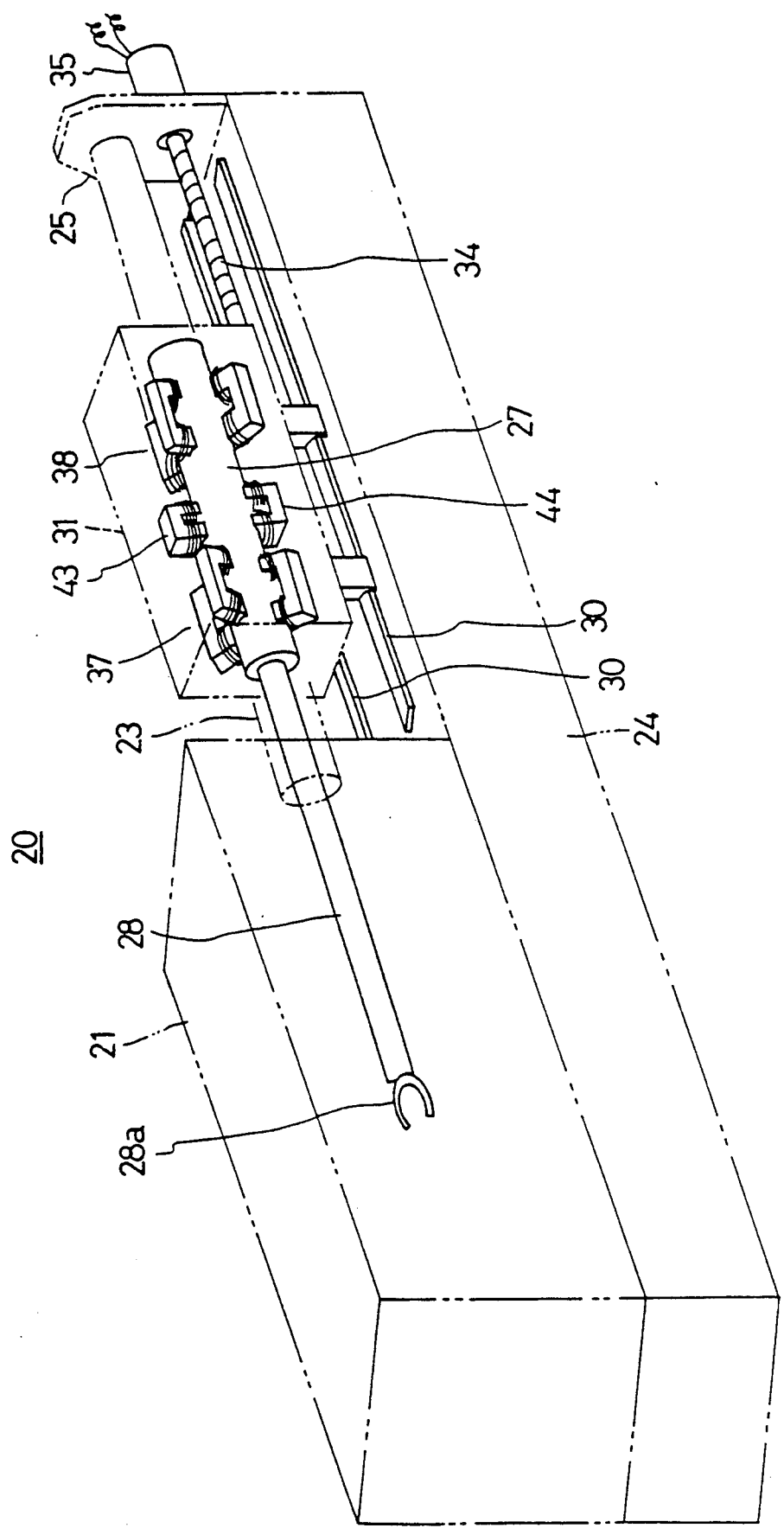

TRANSFERRING APPARATUS OPERATED IN A VACUUM CHAMBER

BACKGROUND OF THE INVENTION

1. Field of the Invention

The present invention relates to a transferring apparatus which is operated in a vacuum chamber without generating fine particles. The transferring apparatus of the present invention is suitable for transferring objects such as semiconductor devices in a vacuum chamber.

2. Prior Arts

In general, factories which deal with semiconductor wafers have a manufacturing process which is carried out in a vacuum environment such as in a vacuum chamber. This process environment requires a transferring apparatus which transfers semiconductor devices and other objects without generating fine particles during transfer of objects.

A typical conventional transferring apparatus which is used in such a vacuum environment is schematically shown in FIG. 12. The conventional transferring apparatus shown in FIG. 12 has the following structure. A carrier member 6 with a support 5 provided at its one end is slidably disposed in its axial direction within a pipe 4 through sliding bearings 2 and 3. The pipe communicates with a vacuum chamber 1. Magnets 10 and 11 are provided at the other end of the carrier member 6, and magnets 12 and 13 are provided at an external handle 8. The handle 8 is moved for shifting the carrier member 6 in its axial direction by the magnetic attraction working between the magnets 10 and 11 and the magnets 12 and 13, whereby an object held on the carrier member 5 is shifted to a desired position.

However, the carrier member 6 moves within the pipe 4 in its axial direction in contact with the bearing 2 and 3. Because of this structure, fine particles are generated at the points in contact, and most likely adhere to semiconductor wafers or other objects being transferred within the vacuum chamber 1.

SUMMARY OF THE INVENTION

It is an object of the present invention to provide a transferring apparatus which is operable in a vacuum chamber without generating fine particles while objects are being transferred. The transferring apparatus according to the present invention comprises a vacuum chamber which communicates with a pipe of nonmagnetic material, a carrier member formed from a magnetic material with a manipulator arm attached thereto which extends into the vacuum chamber, and which is movably disposed in its axial direction within the pipe, a support structure disposed movable along the pipe which passes through the support structure, magnetic means for radially floating and axially pulling the carrier member by magnetic forces installed in the support structure wherein the magnetic means is disposed facing the periphery of the carrier member through the wall of the pipe, and driving means for shifting the support structure along the pipe.

It is another object of the invention to provide rotation regulator means with the transferring apparatus operated in a vacuum chamber for regulating the rotation of the carrier member, whereby the rotation of the carrier member is detected by sensor means provide over discontinuities formed in the periphery of the carrier member and the rotation is regulated in the circumferential direction by magnetic forces.

It is still another object of the invention to provide tilt driving means for tilting upwardly and downwardly the manipulator arm of the carrier member in the vacuum chamber.

BRIEF DESCRIPTION OF THE DRAWINGS

FIG. 1-FIG. 11 show an embodiment of the transferring apparatus operated in a vacuum chamber according to the invention, FIG. 1 is a partially cutaway view of the transferring apparatus operated in a vacuum chamber, FIG. 2 is a side view of the pipe and carrier member of the transferring apparatus operated in a vacuum chamber, FIG. 3 is a sectional view taken along the line III—III of FIG. 2, FIG. 4 is a front sectional view of the carrier showing the disposition of the electromagnets 37a-37d, and 38a-38d, FIG. 5 is a front sectional view of the carrier showing the disposition of the gap detection sensors 40a-40d, FIG. 6 is a side view of the electromagnet 37 and the carrier member, FIG. 7 is a control block diagram of the electromagnets 37 and 38, FIG. 8 is a front sectional view of the carrier showing the disposition of the electromagnets 43 and 44, FIG. 9 is a front sectional view of the carrier showing the disposition of the revolution sensors 46 and 47, FIG. 10 is a control block diagram of the electromagnets 43 and 44, FIG. 11 is a control block diagram illustrating the tilt drive means for the electromagnets 37 and 38.

DETAILED DESCRIPTION OF THE PREFERRED EMBODIMENTS

Embodiments of the invention are hereunder described with reference to the accompanying drawings.

FIG. 1 to FIG. 11 show an embodiment of a transferring apparatus operated in a vacuum chamber according to the invention.

Figure 2:
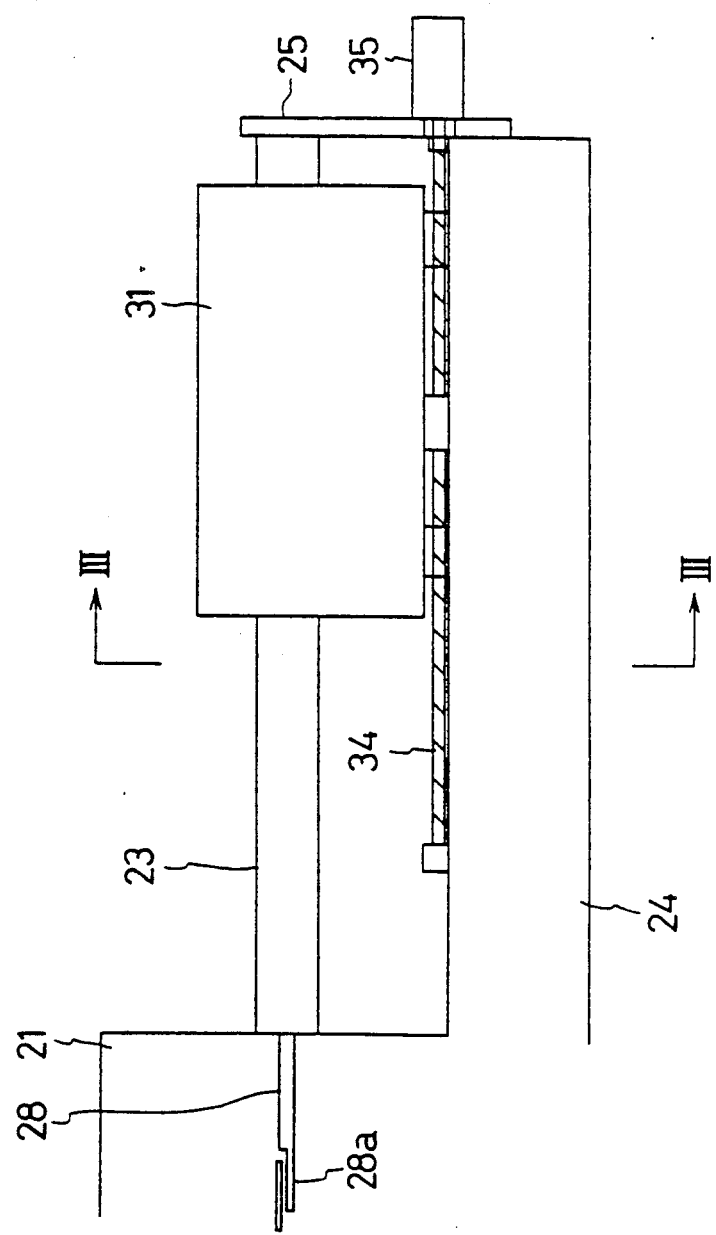

FIG. 1 shows a transferring apparatus 20 operated in a vacuum chamber 21. A vacuum chamber 21 holds its interior in a vacuum. The right end of the vacuum chamber 21 is connected to a pipe 23 of thin wall thickness which communicates with the vacuum chamber 21 and is also kept in a vacuum. The pipe 23 is made of nonmagnetic material and is formed in a circle in its section. The vacuum chamber 21 is provided on a bed frame 24, and as shown in FIG. 2, the right end (in the figure) of the pipe 23 is joined to a retainer 25 which is vertically provided on the right end (in the figure) of the bed frame 24, and the joint is hermetically sealed.

A carrier member 27, made of iron (magnetic material) and formed in a circle in its section, is provided in a movable manner in its axial direction. A manipulator arm 28, has one end which extends into the vacuum chamber 21 and is fixed to the left end (in FIG. 1) of the carrier member 27. A holder 28a for holding an object thereon is provided at one end of the manipulator arm 28 in the vacuum chamber.

Figure 3:
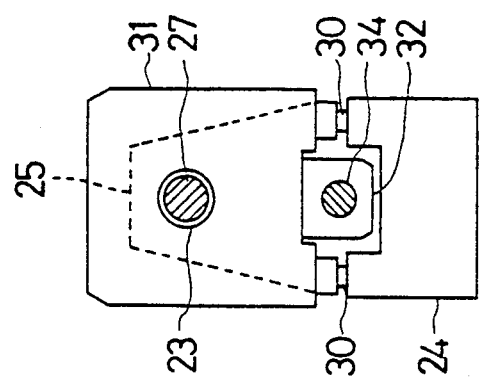
Figure 4:
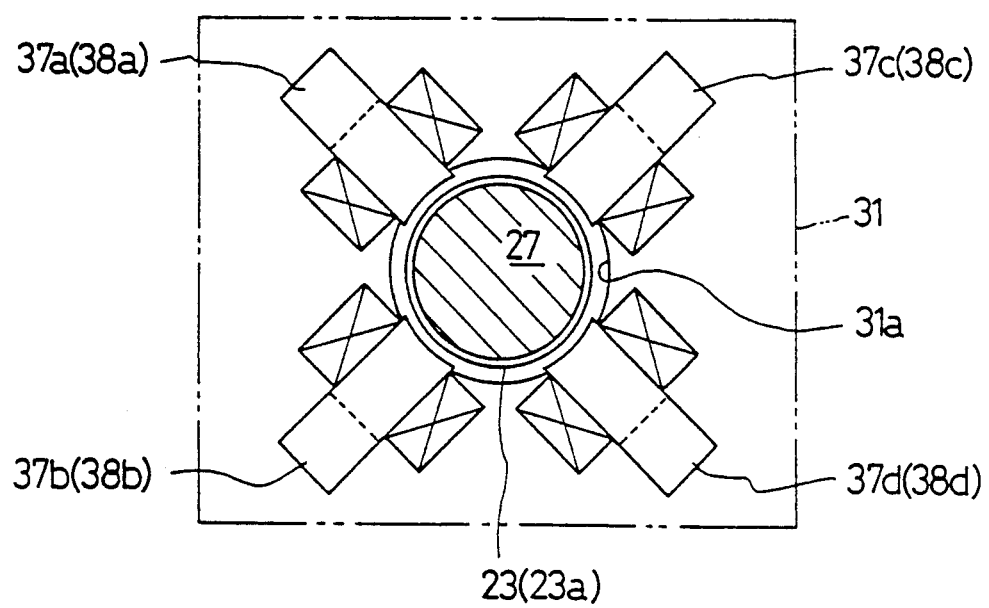

On the right half side of the bed frame 24 shown in FIG. 1, a pair of guide rails 30 as shown in FIG. 3 is installed. A rectangular carrier 31 (a supporting structure) is mounted on the guide rails 30 in a manner movable along the guide rails. A through-hole 31a is provided in the carrier 31 along the axial direction of the carrier 31 as shown in FIG. 4. The pipe 23 is passed through the through-hole 31a, and the carrier 31 is movably disposed along the pipe 23.

A protrusion 32 is fixed to the bottom of the carrier 31 as shown in FIG. 3. The protrusion 32 is geared with a ball-screw 34 through balls (unshown). The ball-screw 34 is provided on the base frame 24 in parallel with the pipe 23 as shown in FIG. 1, and is rotated by a motor 35 which is installed on the outer face of the retainer 25, whereby carrier 31 is moved along the pipe 23. Each four electromagnets 37 and 38 (37a–37d, 38a–38d) (magnetic means) are provided near both ends of the through-hole 31a in the carrier 31 as shown in FIG. 1. The electromagnets 37a–37d and 38a–38d are disposed at diagonally crossed positions as shown in FIG. 4. The ends thereof on the side of the pipe 23 face the periphery of the carrier member 27 through the wall 23a of the pipe 23. These electromagnets 37 and 38 radially float the carrier member 27, and pull the carrier member 27 in its axial direction.

Figure 5:
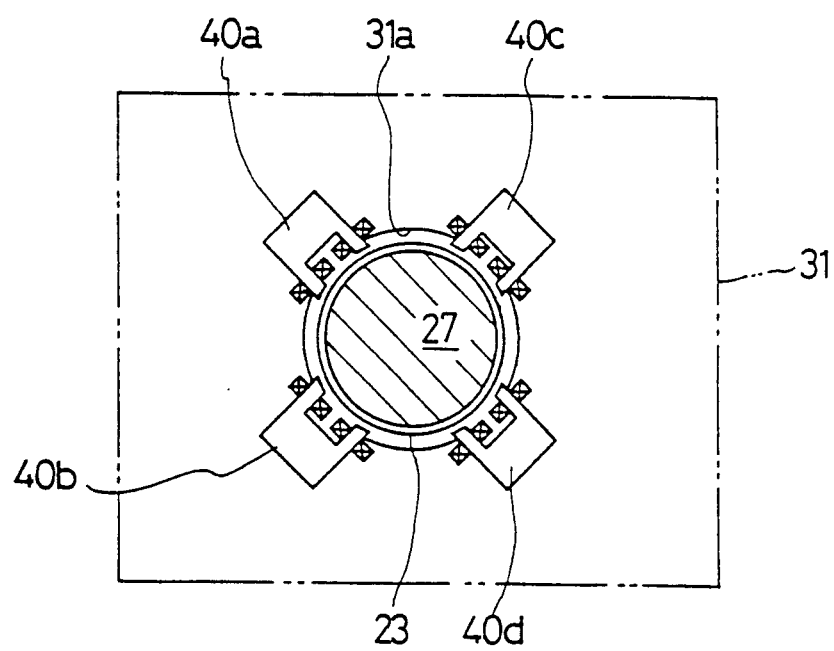
Figure 6:
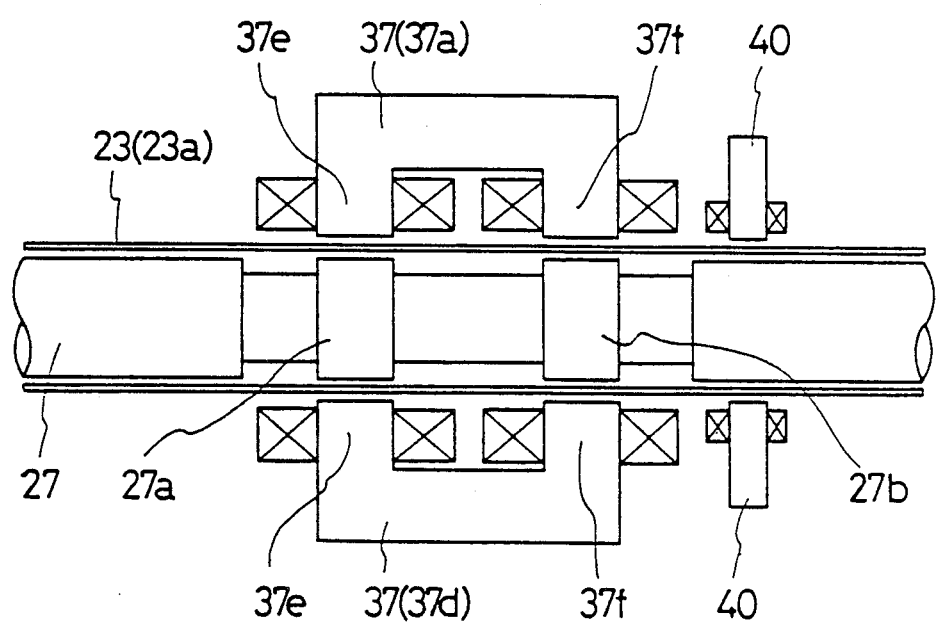
Figure 7:
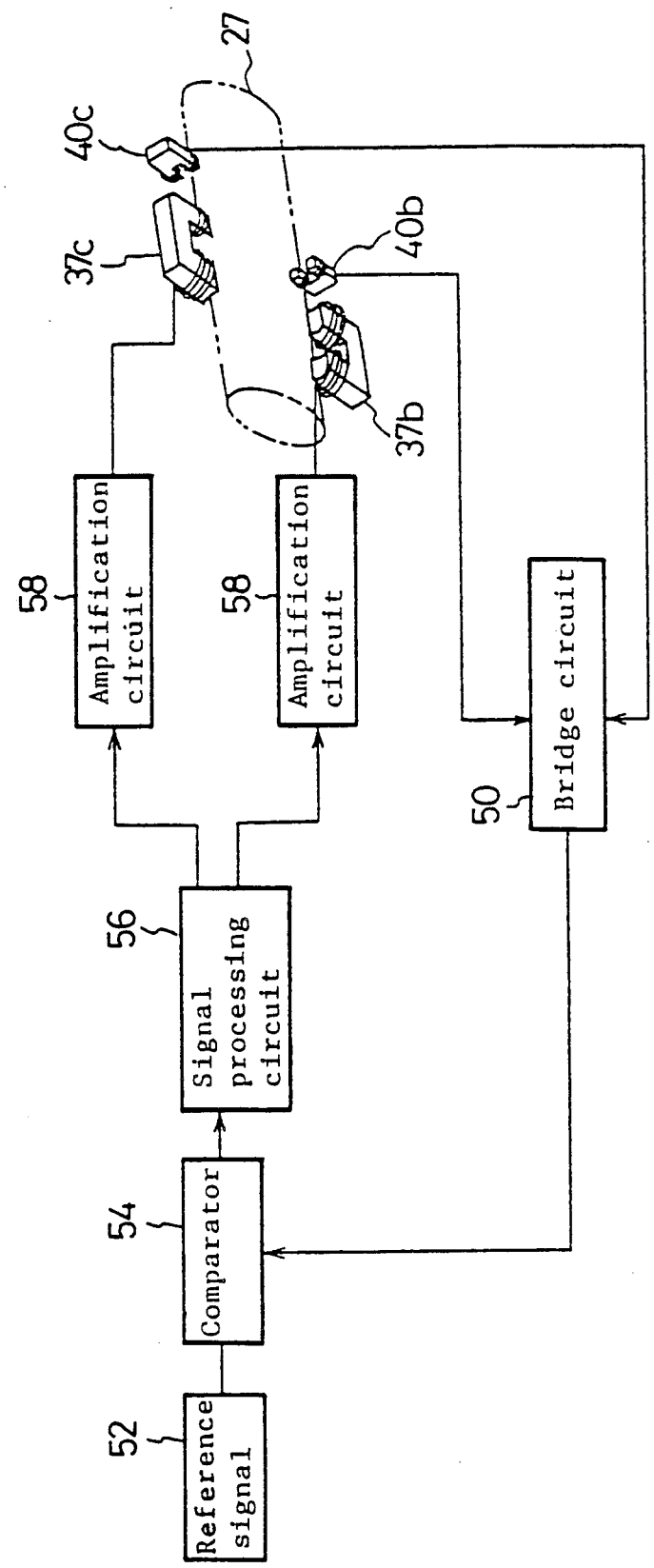

As shown in FIG. 6, near the electromagnets 37, gap sensors 40 are disposed in the same diagonally crossed orientation as that of the electromagnets 37 and 38 (40a–40d as shown in FIG. 5) along the through-hole 31a in the carrier 31. The sensors detect gaps between the internal end faces 37e and 37f of the electromagnets 37 and the peripheries of the lands 27a and 27b of the carrier member 27. Other gap sensors 42 are similarly disposed near the electromagnets 38.

By the electromagnets 37 and 38, and gap sensors 40 and 42 composed in the above configuration, the carrier member 27 is magnetically floated in the radial direction within the pipe 23. The control method thereof is hereunder described with reference to the block diagram in FIG. 7. First, the gap sensor 40c detects the gap G1 between the electromagnet 37c and the periphery of the carrier member 27; and the gap sensor 40b detects the gap G2 between the electromagnet 37b and the periphery of carrier member 27. Signals corresponding to the two gaps G1 and G2 detected in this manner are inputted into a bridge circuit 50, then the output signal from the bridge circuit 50 is compared by a comparator 54 with a reference signal 52. Based on the result of the comparison, a signal processing circuit 56 then generates appropriate values of electrical current to be fed to the electromagnets 37c and 37b. Each current is amplified by an amplification circuit 58 whereby intensities of magnetic forces of the electromagnets 37c and 37b are controlled to equalize the gaps G1 and G2.

Other electromagnets 37a and 37d, and 38a–38d are controlled and operate in the same manner.

As described above and as shown in FIG. 6, a pair of lands 27a and 27b are formed around the carrier member 27 in such a manner that they face a pair of the internal end faces 37e and 37f of the electromagnet 37. By the magnetic attraction working between the internal end faces 37e and 37f of the electromagnet 37 and the lands 27a and 27b, the electromagnet 37, namely the carrier 31, and the carrier member 27 shift by the same amount in the same direction, or stop at the same position. At the same time, the electromagnet 38 operates in the same manner.

Figure 8:
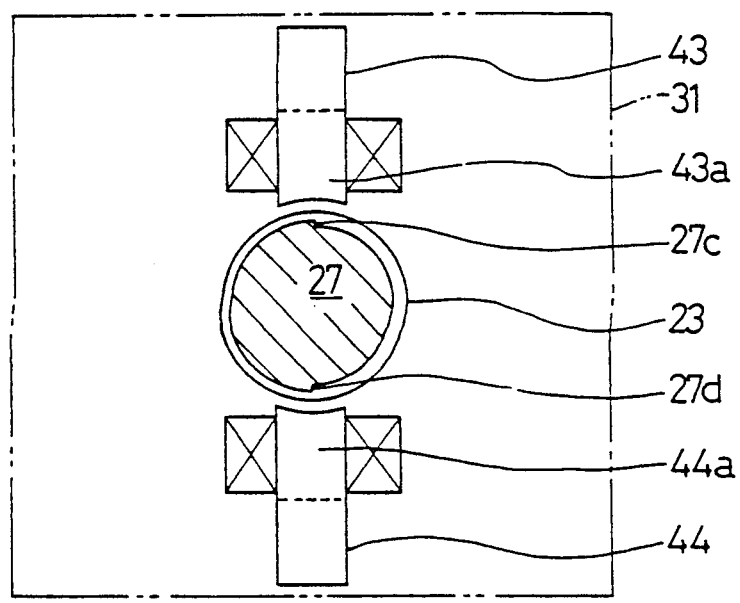
Figure 9:
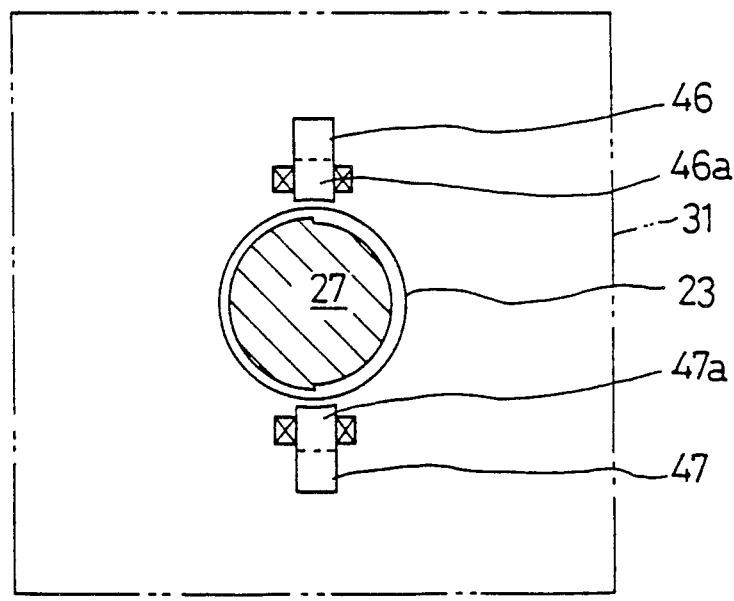
Figure 10:
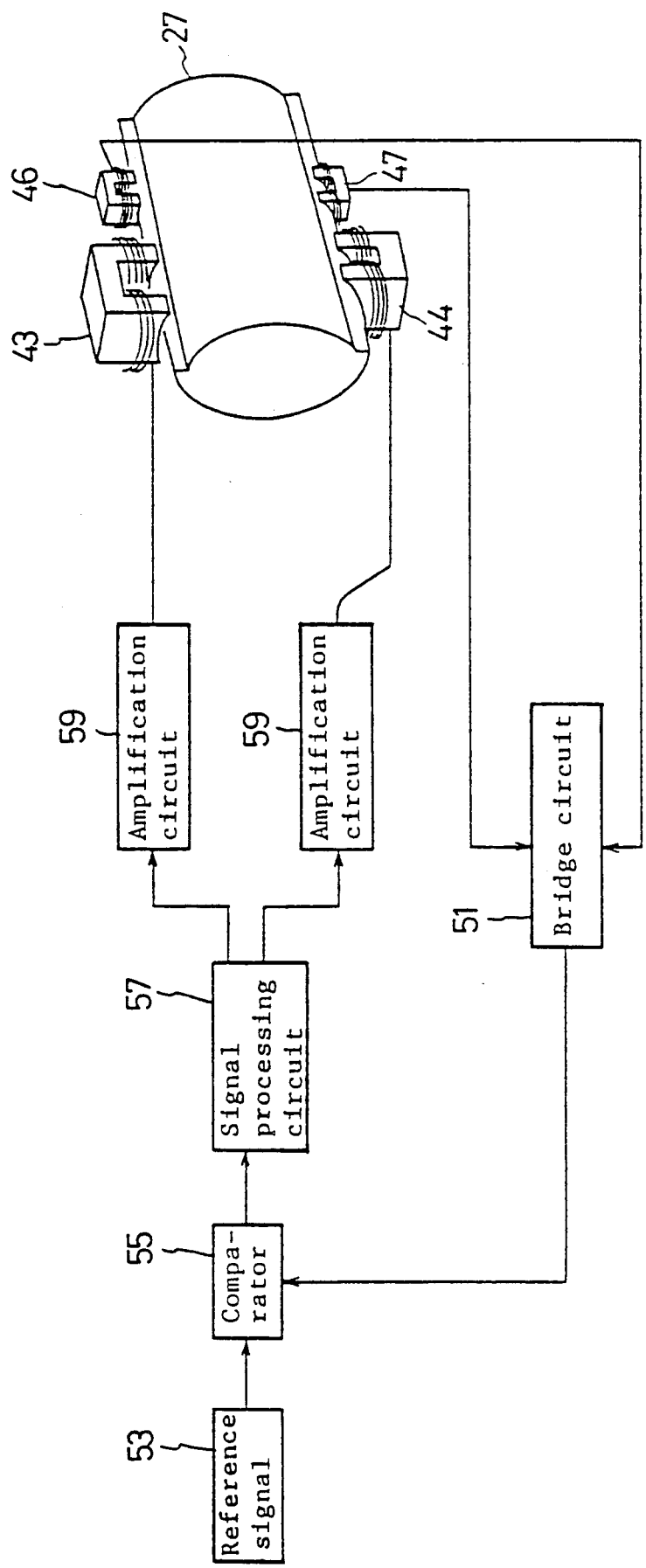
Figure 11:
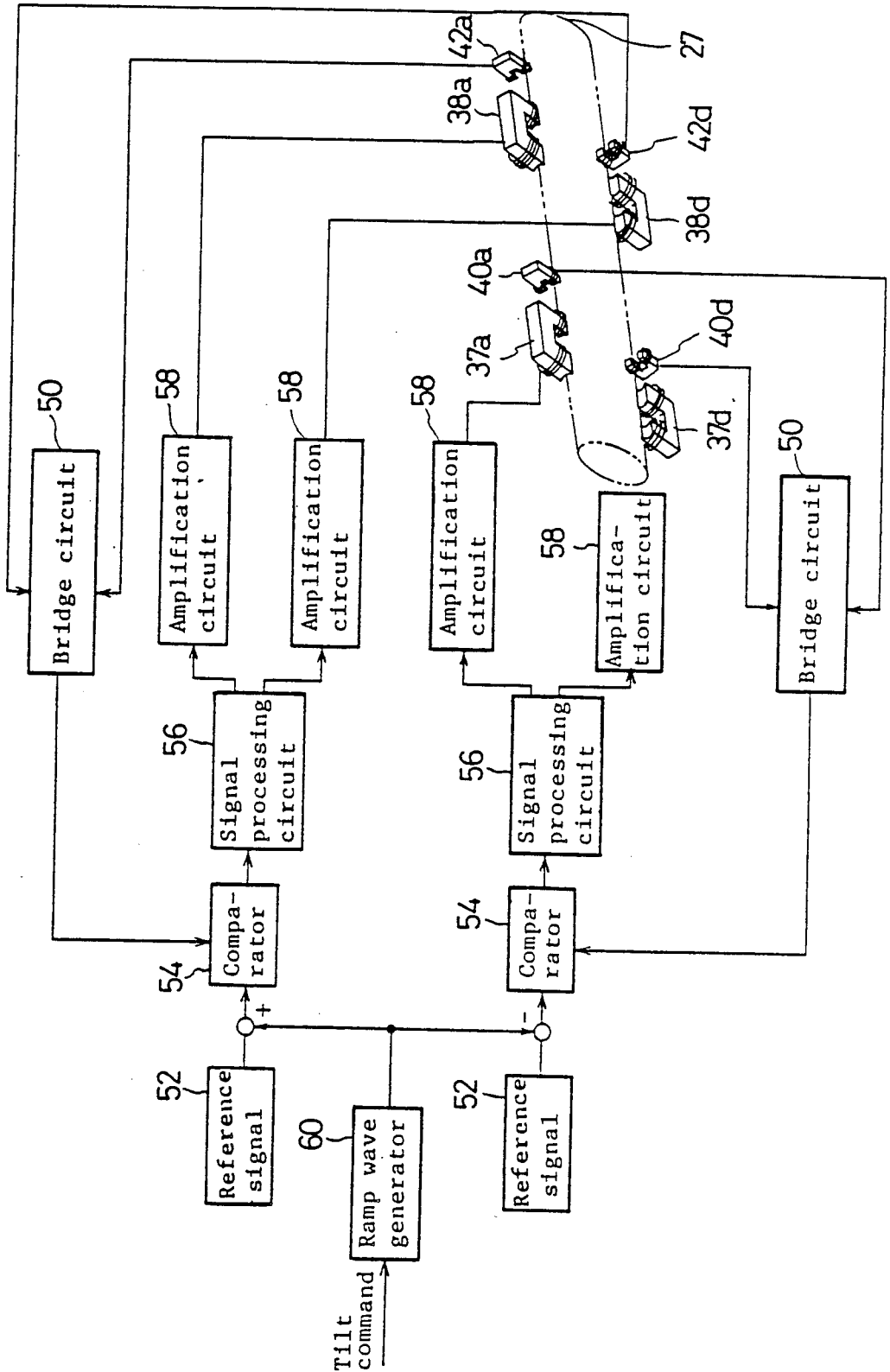
Figure 12:
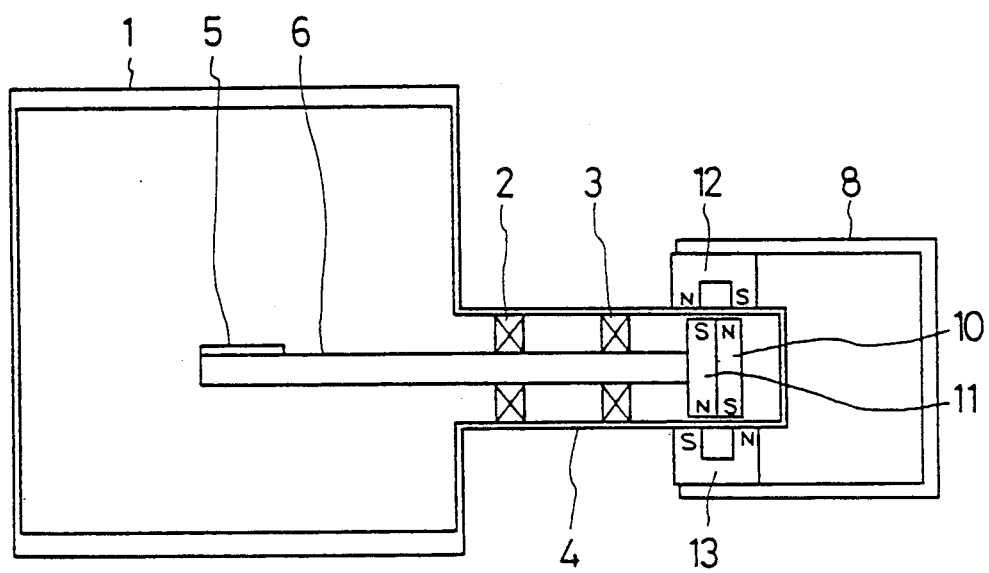
FIG. 12 is a side view of a conventional transferring apparatus.

As shown in FIG. 1 and FIG. 8, a pair of electromagnets 43 and 44 are provided in the middle of the longitudinal length of the through-hole 31a in the carrier 31, and revolution sensors 46 and 47, which detect the amount of revolution of the carrier member 27 in its circumferential direction, are provided in the proximity of each of the electromagnets 43 and 44 (FIG. 9). In the periphery of the carrier member 27 which faces the internal end faces 43a and 44a of the electromagnets 43 and 44, and end faces 46a and 47a of the revolution sensors 46 and 47, a pair of steps 27c and 27d thereby reducing the diameter of the carrier member 27 are formed as shown in FIG. 8 and FIG. 9. When the revolution sensors 46 and 47 detect changes in inductance resulting from the revolution of the steps 27c and 27d, namely the revolution of the carrier member 27, the electromagnets 43 and 44 generate such magnetic forces to restore the carrier member 27 to its original position according to the control method as shown in the block diagram in FIG. 10 (in the similar manner as in the case of the electromagnets 37 and 38). In this embodiment, steps are provided in the circular periphery of the carrier member 27. However, it will be understood that other shapes of discontinuity can be provided in the carrier member in order to produce changes in the inductance when the carrier member rotates. Further, the manipulator arm 28 of the carrier member 27 can be vertically tilted in the vacuum chamber 21. By this operation, an object to be transferred can be loaded on and off the holder 28a which is attached to the tip of the manipulator arm 28. As shown in FIG. 11, a ramp wave generator 60 is provided to output ramp waves to the two reference signals 52 which control the above-mentioned electromagnets 37 and 38. When a tilt command signal is inputted into the ramp wave generator 60 by a manual switch or the like, the ramp wave outputted from the ramp wave generator 60 is added to one of the reference signals and also subtracted from the other.

By this operation, as shown in FIG. 6 for example, the gap between the electromagnet 37a and the carrier member 27 is made larger than the gap between the electromagnet 37d and the carrier member 27, while the gaps between the electromagnets 38 and the carrier member 27 are adjusted in the reverse relation of the gaps at the side of the electromagnets 37, whereby the manipulator arm 28 of the carrier member 27 in the vacuum chamber 21 can be moved in a plane, the plane defined by the center of carrier member 27 and electromagnets 37a (38a) and 37d (38d) or by the center of carrier member 27 and electromagnets 37c (38c) and 37b (38b) angled at 45° from the vertical plane. At the same time, the electromagnets 37c, 37b and 38c, 38b which are disposed perpendicular to the electromagnets 37a, 37d and 38a, 38d are controlled in the same manner as described above. As a result, the manipulator arm 28 of the carrier member 27 can be tilted upward and downward in the vertical plane in the vacuum chamber 21 within the confines of pipe 23.

According to the transferring apparatus 20 operated in a vacuum chamber, when an object, placed on the holder 28a which is provided at the tip of the manipulator arm 28 of the carrier member 27, is transferred in the vacuum chamber 21, the carrier member 27 is magnetically floated within the pipe 23 by the electromagnets 37 and 38, and is moved in its axial direction without contact with the pipe 23. Therefore there are not any parts which move relatively in contact with each other within the vacuum chamber 21 nor within the pipe 23, no fine particles are generated within the vacuum chamber 21 nor within the pipe 23, whereby adherence of fine particles to objects being transferred is effectively eliminated. In the above embodiment, the sections of the pipe 23 and the carrier member 27 are formed in a circle, but they can be formed in different shapes other than a circle, such as a square, etc.

Also in the above embodiment, the electromagnets 37 and 38 are disposed in diagonally crossed orientations, but the electromagnets 37 and 38 may be disposed in upright cross orientations which are composed of horizontal and vertical orientations.

As described in the foregoing, according to the transferring apparatus operated in a vacuum chamber of the invention, particle generations in a vacuum chamber are completely eliminated while objects are transferred therein, whereby adherence of particles to objects within the vacuum chamber is prevented.

We claim:

1. A transferring apparatus operated in a vacuum chamber comprising:
    a vacuum chamber communicating with a pipe of nonmagnetic material;
    a carrier member formed with a magnetic material and having a manipulator arm which extends into said vacuum chamber, said carrier member being disposed movable in the axial direction within said pipe;
    magnetic means for radially floating and axially pulling said carrier member by magnetic force, said magnetic means being disposed facing the periphery of said carrier member through the wall of said pipe;
    support means movably disposed along said pipe which passes through said support means, and including therein said magnetic means;
    driving means for shifting said support means along said pipe; and
    tilt driving means for tilting the manipulator arm upward and downward relative to said pipe in said vacuum chamber.

2. A transferring apparatus operated in a vacuum chamber according to claim 1; wherein said pipe has a circular section and said carrier member has a circular section with at least one discontinuity therein, and further comprising rotation regulator means at said at least one discontinuity for regulating the rotation of said carrier member in its circumferential direction.

3. A transferring apparatus operated in a vacuum chamber comprising:
    a vacuum chamber communicating with a pipe of nonmagnetic material and having a circular section;
    a carrier member formed with a magnetic material and having a manipulator arm which extends into said vacuum chamber, said carrier member being disposed movable in the axial direction within said pipe and having a circular section with at least one discontinuity therein;
    magnetic means for radially floating and axially pulling said carrier member by magnetic force, said magnetic means being disposed facing the periphery of said carrier member through the wall of said pipe;
    support means movably disposed along said pipe which passes through said support means and including therein said magnetic means;
    driving means for shifting said support means along said pipe; and
    rotation regulator means at said at least one discontinuity for regulating the rotation of said carrier member in its circumferential direction.

4. A transferring apparatus comprising:
    a vacuum chamber;
    means defining a passage in communication with the chamber and composed of nonmagnetic material;
    a carrier member composed of magnetic material and extending through the passage with clearance and having a manipulator arm at an end thereof extending into the vacuum chamber;
    magnetic means for radially magnetically floating the carrier member in the passage and for axially magnetically pulling the carrier member;
    means for moving the magnetic means along the passage to effect axial movement of the carrier member; and
    means for radially moving the carrier member relative to the passage to effect a vertical tilting of the manipulator arm in the vacuum chamber.

5. A transferring apparatus according to claim 4, wherein the means for moving the magnetic means comprises movable support means disposed along the passage and on which the magnetic means are mounted, and means for moving the support means along the passage.

6. A transferring apparatus according to claim 4, wherein the means defining the passage comprises a pipe.

7. A transferring apparatus according to claim 6, wherein the pipe is circular in cross section and the carrier is circular in cross section and has at least one discontinuity, and further comprising means disposed at the at least one discontinuity for rotating the carrier member in a circumferential direction.

* * * * *